(12) United States Patent
Lederer et al.

(10) Patent No.: US 7,589,418 B2
(45) Date of Patent: *Sep. 15, 2009

(54) PRESSURE CONTACT POWER SEMICONDUCTOR MODULE

(75) Inventors: Marco Lederer, Nürnberg (DE); Rainer Popp, Petersaurach (DE)

(73) Assignee: SEMIKRON Elektronik GmbH & Co. KG, Nürnberg (DE)

( * ) Notice: Subject to any disclaimer, the term of this patent is extended or adjusted under 35 U.S.C. 154(b) by 206 days.

This patent is subject to a terminal disclaimer.

(21) Appl. No.: 11/705,728

(22) Filed: Feb. 13, 2007

(65) Prior Publication Data

US 2007/0194429 A1    Aug. 23, 2007

(30) Foreign Application Priority Data

Feb. 13, 2006    (DE) ................ 10 2006 006 425

(51) Int. Cl.
    *H01L 23/34*    (2006.01)
(52) U.S. Cl. .................. 257/719; 257/785; 438/122
(58) Field of Classification Search ........... 257/719, 257/785, E33.075, E31.131, E23.051; 438/122
    See application file for complete search history.

(56) References Cited

U.S. PATENT DOCUMENTS

| | | | | |
|---|---|---|---|---|
| 5,345,107 A | * | 9/1994 | Daikoku et al. | 257/717 |
| 2004/0089941 A1 | * | 5/2004 | Mamitsu et al. | 257/718 |
| 2007/0187817 A1 | * | 8/2007 | Popp | 257/723 |
| 2007/0194443 A1 | * | 8/2007 | Lederer et al. | 257/723 |

FOREIGN PATENT DOCUMENTS

| | | |
|---|---|---|
| DE | 42 37 632 | 5/1994 |
| DE | 197 19 703 | 11/1998 |
| DE | 199 03 875 | 8/2000 |
| DE | 101 27 947 | 10/2002 |
| DE | 10 2004 021 927 | 12/2005 |

* cited by examiner

*Primary Examiner*—Theresa T Doan
(74) *Attorney, Agent, or Firm*—Cohen Pontani Lieberman & Pavane LLP

(57) ABSTRACT

A power semiconductor module in a pressure contact embodiment, for disposition on a cooling component, in which load terminals are formed as metal molded bodies, each with at least one flat portion and having a plurality of contact feet extending from the flat portion. Each flat portion of the load terminal is disposed parallel to, and spaced from, the substrate. The contact feet also extend from the flat portion to the substrate, where they form the contacts of the terminal elements. A molded insulation body is disposed between the flat portions of the load terminals and the substrate, and this molded insulation body has recesses for permitting the passage therethrough of the contact feet.

7 Claims, 3 Drawing Sheets

PRESSURE CONTACT POWER SEMICONDUCTOR MODULE

BACKGROUND OF THE INVENTION

1. Field of the Invention

The invention is directed to a power semiconductor module used in a pressure contact embodiment, with controllable power semiconductor components.

2. Description of the Related Art

In the prior art, such as German Patent Application No. DE 197 19 703 A1, power semiconductor modules comprise a housing with at least one electrically insulating substrate disposed therein, preferably for direct mounting on a cooling component. The substrate in turn comprises an insulation body having a plurality of metal connection tracks located thereon and insulated from one another, and power semiconductor components located thereon and connected to the connection tracks. Moreover, known power semiconductor modules have load terminals for connecting to an external load as well as auxiliary terminals, and also have connecting elements located in the interior of the module. These connecting elements for connections in the interior of the power semiconductor module are usually embodied as wire bond connections.

Pressure-contacted power semiconductor modules are also known, of the kind disclosed in German Patent Applications Nos. DE 42 37 632 A1 and DE 199 03 875 A1, or in German Patent No. DE 101 27 947 C1. In the first of these references, the pressure device has a stable, preferably metal, pressure element for pressure buildup, an elastic pad element for pressure storage, and a bridge element for introducing pressure to separate regions of the substrate surface. The bridge element is preferably designed as a plastic molded body with a face oriented toward the pad element, from which face many pressure prongs emanate in the direction of the surface of the substrate.

By means of this kind of pressure device, the substrate is pressed against a cooling component, and the heat transfer between the substrate and the cooling component is thus permanently assured. The elastic pad element maintains constant pressure conditions under various thermal loads and over the entire service life of the power semiconductor module.

German Patent Application No. DE 199 03 875 A1 develops this known pressure element further such that on the one hand it has an especially advantageous ratio of weight to stability, and, on the other, it has electrically insulated openings for permitting the passage therethrough of conductive elements. To that end, the pressure element is formed as a plastic molded body with a metal core on the inside. This metal core has recesses for the passage of terminals, preferably auxiliary terminals in a spring contact embodiment. The plastic molded body surrounds these recesses in such a way that the auxiliary terminals are electrically insulated from the metal core by the plastic molded body.

Further-developed pressure elements are also known which have many pressure prongs on their surface oriented toward the substrate. Preferably, the metal core also has a pre-set sag. When the two provisions are combined, a pressure element of this kind can furnish the entire functionality of an aforementioned pressure device.

German Patent No. DE 101 57 947 C1 discloses a power semiconductor module in which the load terminals are embodied such that they extend in portions closely adjacent to and perpendicular to the substrate surface and have contact feet extending therefrom that furnish the electrical contact with the conductor tracks, while also exerting pressure on the substrate, and thereby establish its thermal contact with a cooling component. The pressure is introduced and stored using means of the prior art.

German Patent Application No. DE 10 2004 021 927 A1 describes a method for internally insulating power semiconductor modules. In contrast to the previously known prior art, they are not filled with an insulating silicone gel up to a defined fill level. Rather, this patent discloses a method for coating the components and connecting elements to be insulated which is quite economical in terms of the amount of silicone gel needed.

SUMMARY OF THE INVENTION

The object of the invention is to present a power semiconductor module in a pressure contact embodiment which provides improved internal insulation, with a simple pressure contact.

It is a further object of invention to provide a power semiconductor module which preferably includes a coating for insulating the substrate.

In accordance with these objects, there is provided a power semiconductor module in a pressure contact embodiment for disposition on a cooling component. The power semiconductor module has at least one substrate, at least two controllable power semiconductor components, such as bipolar transistors, disposed on the substrate, a housing, and outward-leading load and control terminals. The substrate itself has an insulation body, with a first main face thereof being oriented toward the interior of the power semiconductor module. The substrate also has conductor tracks with load potential. The substrate preferably further has at least one conductor track with control potential for triggering the power semiconductor components.

The power semiconductor module furthermore has load terminals, each embodied as a metal molded body, with a flat portion and with a plurality of contact feet extending from the flat portion. The various flat portions are disposed parallel to, and spaced from, the surface of the substrate. The contact feet that originate at the flat portion extend to the substrate, where they provide electrical contact with the load terminals. For that purpose, they preferably contact the conductor tracks, but alternatively they may contact the power semiconductor components directly.

A molded insulation body is disposed between the flat portions of the load terminals to form thereby a stack. This molded insulation body has recesses for permitting the contact feet to pass therethrough. The molded insulation body here preferably forms a completely closed surface, which has recesses only for electrical terminal elements. It may also be preferred if the molded insulation body also has recesses for fastening devices of the power semiconductor module on the cooling component.

Power semiconductor modules embodied in this way in a pressure contact embodiment, because of the additional insulating intermediate layer between the flat portions of the load terminals and the substrate carrying the power semiconductor components and the internal connections of the module, have substantially improved internal insulation. This enhances the fail-safe nature of the module during continuous operation of the power semiconductor module.

Additional guide devices for the load terminals, formed integrally with the intermediate layer, simplify pressure contact; the load terminals exert pressure on the substrate and thus connect it thermally to the cooling component. In combination with modern coating methods for internal insulation of the substrate, this embodiment of the power semiconductor module is especially preferred, since here the entire internal insulation is embodied especially advantageously and permits the automated production of the modules.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

A preferred embodiment of the invention will be described in further detail in terms of the exemplary embodiments of FIGS. 1 through 3.

DETAILED DESCRIPTION OF THE PRESENTLY PREFERRED EMBODIMENTS

Figure 1:
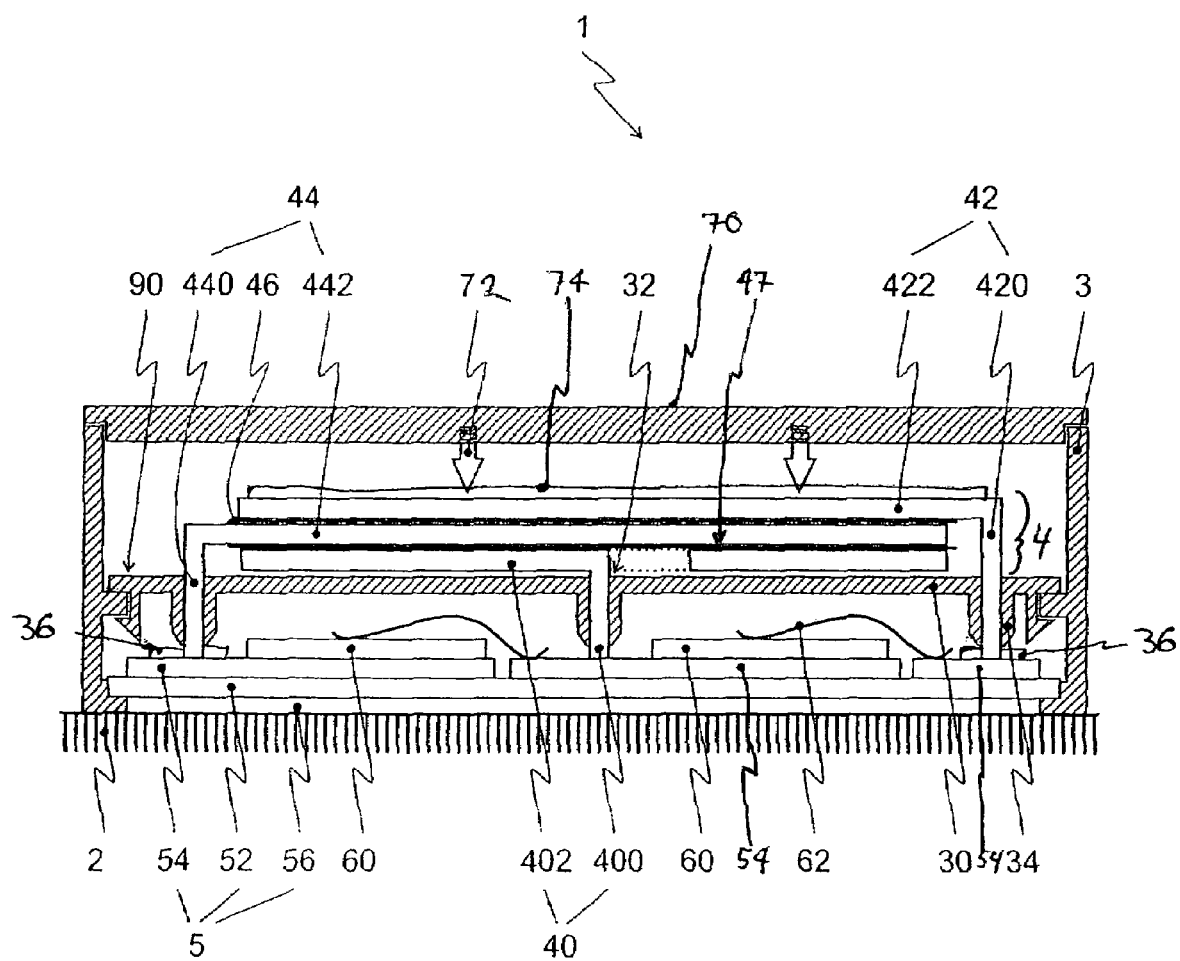
FIG. 1 shows a cross-section through a power semiconductor module of a preferred embodiment of the invention.

FIG. 1 shows a section taken along the line A-A (FIG. 2) through a preferred embodiment of a power semiconductor module 1 in accordance with the invention. Module 1 has a housing 3 with a framelike housing part that is solidly connected to a cooling component 2. The framelike housing part surrounds at least one substrate 5. Substrate 5 in turn has an insulation body 52, preferably formed of an insulating ceramic, such as aluminum oxide or aluminum nitride.

Substrate 5 has a first main face which is oriented toward the interior of power semiconductor module 1 and 5 has an intrinsically structured metal lining. The individual portions of this metal lining, preferably formed from copper make up conductor tracks 54 of the power semiconductor module 1. The second main face of substrate 5, as in the prior art, has an unstructured copper lining 56.

Controllable and/or uncontrolled power semiconductor components 60, such as IGBTs (insulated gate bipolar transistors), each with antiparallel-connected fly-wheel diodes, or MOSFETs are disposed on conductor tracks 54. These are connected correctly in terms of wiring to further conductor tracks 54, for instance by means of wire bond connections 62.

Load terminals 40, 42, 44 with the various necessary potentials connect the power electronic circuit in the interior of power semiconductor module 1 to circuitry (not shown) located on the exterior of module 1. To that end, load terminals 40, 42, 44 are preferably formed as molded metal bodies, which each have one flat portion 402, 422, 442 respectively, disposed parallel to the surface of substrate 5. Flat portions 402, 422, 442 are spaced from one another by insulation 46, 47, preferably formed of plastic film, to thereby form a stack 4. Any auxiliary terminals with which module 1 may be used are not shown in this sectional view, for the sake of simplicity.

Power semiconductor module 1 furthermore has an intermediate layer, embodied as a molded insulation body 30, between stack 4 of flat portions 402, 422, 442 and substrate 5.

Molded insulation body 30 is preferably secured in this embodiment in framelike housing 3 by means of a snap-detent connection 90.

Molded insulation body 30 in turn has recesses 32 for permitting passage therethrough of contact feet 400, 420, 440. It is especially preferred if recesses 32 are embodied as guides for contact feet 400, 420, 440, and, as a result, the positioning of load terminals 40, 42, 44 relative to the substrate 5 or its conductor tracks 54 is improved still further, compared to an arrangement with simple recesses.

In a further especially preferred feature of molded insulation body 30, recesses 32 are formed as chutes 34, which extend to near the surface of substrate 5. Advantageously, chutes 34 extend into an insulation layer 36 of substrate 5, such as a silicone gel applied to substrate 5 by any known coating method. As a result, especially effective internal insulation of the power semiconductor module 1 is embodied.

Pressure device 70 is disposed on top of stack 4, and oriented to apply pressure to the top of stack 4, and thereby effect thermal connection of power semiconductor module 1 to cooling component 2 and simultaneously effect electrical connection of load terminals 40, 42, 44 to conductor tracks 54. Pressure device 70 includes a pressure element of any known kind (shown diagrammatically as arrow 72) for applying pressure buildup as well as by an elastic pad element 74, for storing pressure. The pressure is applied to stack 4 via pad element 74 from flat portions 402, 422, 442 of load terminals 40, 42, 44 and thus exerts pressure on contact feet 400, 420, 440. As a result, conductor feet 400, 420, 440 are connected electrically conductively to conductor tracks 54.

Pressure devices 70 of this kind have proven especially contact-secure over the service life of power semiconductor modules 1. Forming recesses 32 as chutes 34 to more precisely align feet 400, 420, 440 in desired contact locations on conductor tracks 54, provides a further benefit to this embodiment of the invention.

Pressure element 72 may be formed, as in the prior art, as a plastic molded body with a suitable metal core on the inside, embodied for instance in bimetallic form; in that case, pressure-storing pad element 74 can be dispensed with. It is also preferred if the pressure element 72 simultaneously serves as a cap for the power semiconductor module 1.

Figure 2:
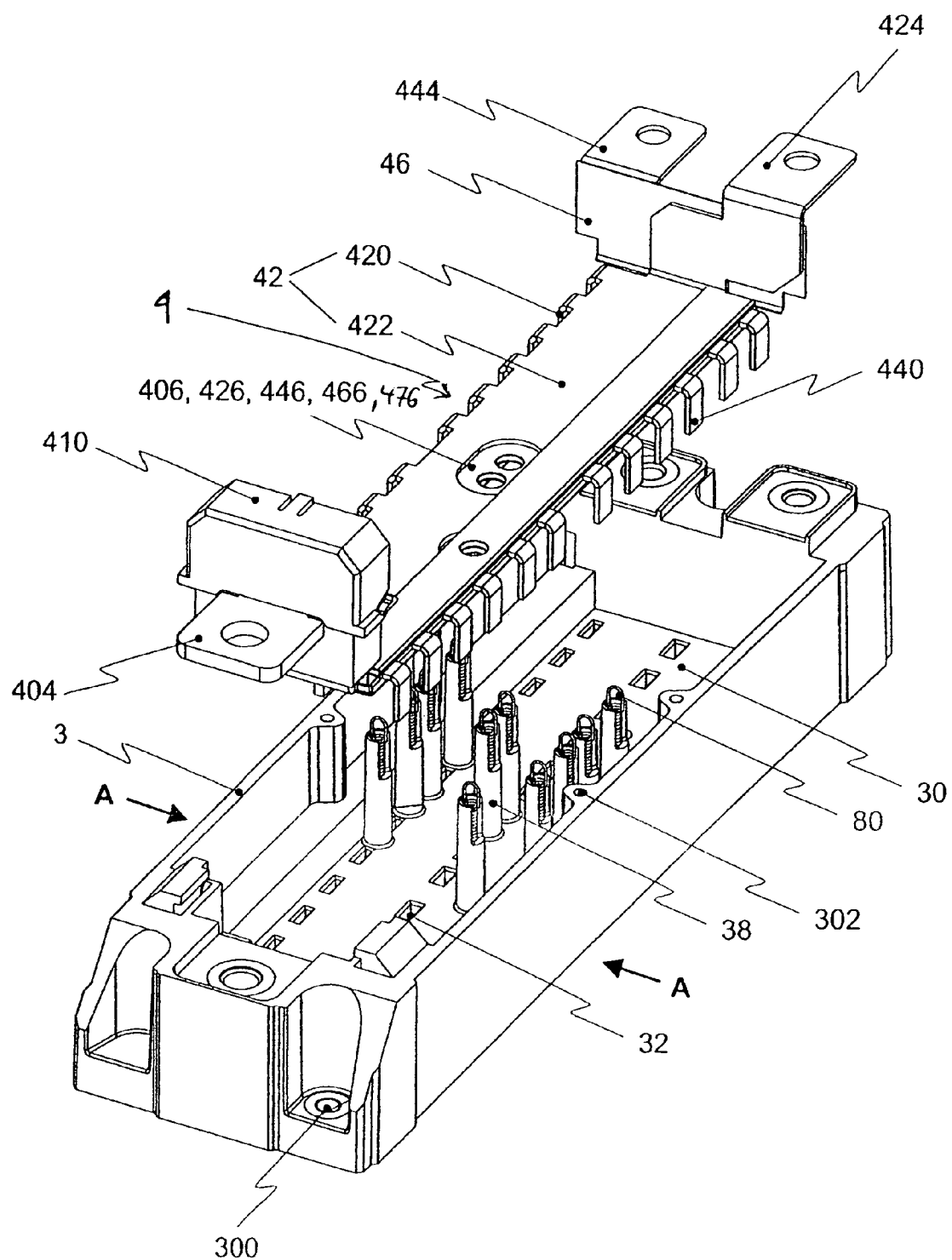
FIG. 2 is a perspective of a power semiconductor module of the invention.

FIG. 2 shows a three-dimensional exploded view of part of the power semiconductor module 1. Housing 3 is shown in more detail, with devices 300 for fastening to cooling component 2 (FIG. 1). Housing 3 has a molded insulation body 30, embodied integrally therewith, which forms an intermediate layer, between substrate 5, located beneath insulation body 30, and stack 4, located above insulation body 30.

Housing 3 furthermore includes fastening devices 302 for a pressure element 72 (FIG. 1), and also has passages 38 for providing access to auxiliary terminals 80. It is especially preferable to embody auxiliary terminals 80 as contact springs, most preferably helical springs.

Load terminals 40, 42, 44 of the various load potentials are each preferably embodied as metal molded bodies with a respective contact device 404, 424, 444 for external connection, at least one flat portion 402, 422, 442, extending parallel to the surface of the substrate, and a plurality of contact feet 400, 420, 440 extending from respective flat portions 402, 422, 442. Load terminals 40, 42, 44 are spaced apart from one another and electrically insulated from one another by insulating plastic film 46. Load terminal 40 also has a current sensor 410, located adjacent to contact device 404.

Contact feet 400, 420, 440 of load terminals 40, 42, 44 extend through recesses 32, to associated contact faces of conductor tracks 54 or of power semiconductor components 60.

Flat portions 402, 422, 442 and their associated insulating plastic films 46, 47 in turn have recesses 406, 426, 446, 466, 476 in those regions in which housing 3 has passages 38 for auxiliary terminals 80. Associated pressure device 70 (FIG. 1) in turn also has corresponding recesses aligned with the recesses of the load terminals, for permitting pressure of auxiliary terminals 80 therethrough.

Figure 3:
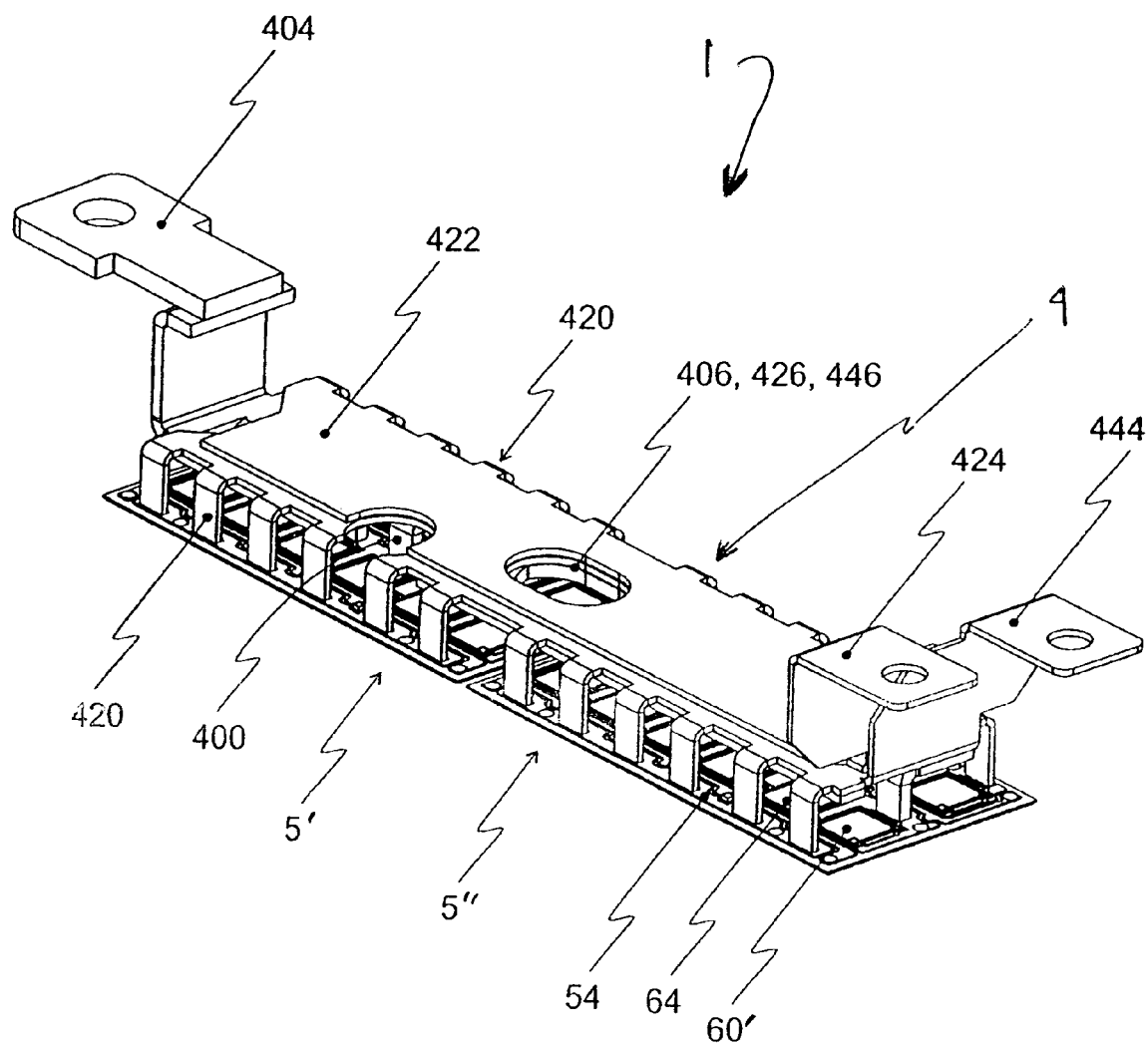
FIG. 3 is a perspective of the load terminals and substrates of a power semiconductor module of the invention.

FIG. 3 shows load terminals 40, 42, 44 of power semiconductor module 1' and their position relative to two substrates 5', 5" in a three-dimensional view, without showing the associated housing, or insulating plastic films between the individual load terminals 40, 42, 44. The circuit of power semiconductor module 1' is a half-bridge circuit, with a plurality of parallel-connected bipolar transistors 60' forming first and second switches. The circuit furthermore has the necessary fly-wheel diodes 64. The first and second switches of the half-bridge circuit are distributed here with half on each of two identical substrates 5', 5".

The plurality of contact feet 400, 420, 440 that originate at the associated flat portions 402, 422, 442 of the respective load terminals 40, 42, 44 is shown. One plurality of contact feet 400, 420, 440 of the same polarity contact the associated conductor tracks 54 of that polarity on both substrates 5', 5". The permanently contact-secure electrical connection is embodied by means of the pressure device described above and shown in FIG. 1.

Recesses 406, 426, 446 of stack 4 are also shown; they are provided for in the disposition of auxiliary terminals 80 shown in FIG. 2.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A power semiconductor module for use in a pressure contact environment, and for disposition on a cooling component, the power semiconductor module comprising:
    a) a substrate having
        an insulation body, and
        conductor tracks disposed on a first main face of said substrate, said first main face being oriented toward the interior of the power semiconductor module;
    b) at least two power semiconductor components disposed on said substrate and electrically connected to said conductor tracks;
    c) a housing forming a portion of the exterior of said power semiconductor module;
    d) at least two conductive load terminals, each of said load terminals being formed of metal and having
        at least one contact;
        a generally flat portion disposed parallel to, and spaced from, said first main face of said substrate; and
        a plurality of contact feet extending from said flat portion and contacting said substrate;
    e) a molded insulation body disposed between said substrate and said load terminals in the region of said respective flat portions thereof, said molded insulation body having a plurality of recesses therein for permitting passage therethrough of respective ones of said plurality of contact feet; and
    f) a pressure device for exerting pressure on said stack to maintain said stack in a desired position in said housing.

2. The power semiconductor module of claim 1, wherein said recesses form guides for said contact feet to contact said conductor tracks.

3. The power semiconductor module of claim 1, wherein said molded insulation body and said housing are formed integrally.

4. The power semiconductor module of claim 1, further comprising an insulating layer disposed on top of said substrate, and wherein said recesses form chutes which extend to near the surface of said substrate and into said insulation layer.

5. The power semiconductor module of claim 1, further comprising an insulating layer disposed between an adjacent pair of load terminals in the region of said flat portions of respective ones of said adjacent pair of load terminals, said load terminals and said insulating layer together forming a stack;
    wherein said pressure device exerts pressure on said stack and thus urges said contact feet into electrical contact with said conductor tracks.

6. The power semiconductor module of claim 1, further comprising auxiliary terminals connected to said substrate and leading to the exterior of said housing;
    wherein said pressure device, said flat portions, and said molded insulation body each have recesses therein for permitting the passage therethrough of said auxiliary terminals.

7. The power semiconductor module of claim 6, wherein said molded insulation body has passages around said recesses for permitting the passage therethrough of said auxiliary terminals.

* * * * *